(12) United States Patent
Tominaga et al.

(10) Patent No.: US 11,977,124 B2
(45) Date of Patent: May 7, 2024

(54) MEASUREMENT DEVICE, MEASUREMENT METHOD, AND STORAGE MEDIUM

(71) Applicant: HONDA MOTOR CO., LTD., Tokyo (JP)

(72) Inventors: Yuki Tominaga, Wako (JP); Yurika Nishimoto, Wako (JP)

(73) Assignee: HONDA MOTOR CO., LTD, Tokyo (JP)

( * ) Notice: Subject to any disclaimer, the term of this patent is extended or adjusted under 35 U.S.C. 154(b) by 0 days.

(21) Appl. No.: 18/113,629

(22) Filed: Feb. 24, 2023

(65) Prior Publication Data

US 2023/0305071 A1    Sep. 28, 2023

(30) Foreign Application Priority Data

Mar. 23, 2022  (JP) ................. 2022-046656

(51) Int. Cl.
  *G01R 31/389*  (2019.01)
  *G01R 27/08*  (2006.01)
(52) U.S. Cl.
  CPC ........... *G01R 31/389* (2019.01); *G01R 27/08* (2013.01)
(58) Field of Classification Search
  None
  See application file for complete search history.

(56) References Cited

U.S. PATENT DOCUMENTS

| 2009/0096459 | A1* | 4/2009 | Yoneda | ................ | G01R 31/367 |
| | | | | | 324/430 |
| 2013/0030736 | A1 | 1/2013 | Tanaka | | |
| 2019/0331737 | A1 | 10/2019 | Kodama et al. | | |
| 2019/0331738 | A1 | 10/2019 | Kodama | | |
| 2019/0334213 | A1 | 10/2019 | Kodama | | |
| 2020/0049771 | A1 | 2/2020 | Mitsui et al. | | |

(Continued)

FOREIGN PATENT DOCUMENTS

| CN | 102901928 | 1/2013 |
| CN | 104914312 | 9/2015 |
| CN | 106897522 | 6/2017 |

(Continued)

OTHER PUBLICATIONS

Japanese Notice of Allowance for Japanese Patent Application No. 2022-046656 dated Oct. 24, 2023.

(Continued)

*Primary Examiner* — Jas A Sanghera
(74) *Attorney, Agent, or Firm* — Amin, Turocy & Watson, LLP

(57) ABSTRACT

A measurement device including an impedance calculator configured to perform following processes S1 to S5 is provided: S1: preparing a Bode diagram; S2: extracting a peak from the Bode diagram; increasing the number of RC parallel circuits by +1, and fitting a mountain shape which is able to be represented by an RC parallel circuit centered on the peak; S3: subtracting a Bode diagram component which is able to be represented by the fitted RC parallel circuit from the Bode diagram of the measurement results; S4: ending identification of the number of RC parallel circuits when a peak is not extracted from the Bode diagram and repeating the processes (S2) and S(3) when a peak is extracted; and S5: reporting the total number of RC parallel circuits.

3 Claims, 5 Drawing Sheets

(56) References Cited

U.S. PATENT DOCUMENTS

2022/0120817 A1  4/2022  Okada et al.

FOREIGN PATENT DOCUMENTS

| | | |
|---|---|---|
| CN | 110412479 | 11/2019 |
| CN | 110416634 | 11/2019 |
| CN | 110416635 | 11/2019 |
| CN | 110867623 | 3/2020 |
| CN | 112327172 | 2/2021 |
| CN | 112763545 | 5/2021 |
| JP | 2008-522350 | 6/2008 |
| JP | 2011-232075 | 11/2011 |
| JP | 2012-079582 | 4/2012 |
| JP | 2013-029412 | 2/2013 |
| JP | 2013-250223 | 12/2013 |
| JP | 2014-010037 | 1/2014 |
| JP | 2015-197363 | 11/2015 |
| JP | 3207998 | 12/2016 |
| JP | 2019-191030 | 10/2019 |
| WO | 2006/056076 | 6/2006 |
| WO | 2020/261799 | 12/2020 |

OTHER PUBLICATIONS

Chinese Office Action for Chinese Patent Application No. 202310099506.1 mailed Jan. 26, 2024.

Gang, "Design of a rapid state evaluation system for lithium-ion batteries based on impedance spectroscopy", China's Excellent Dissertation for the Master Degree in Engineering Full Text Database 01, Jan. 15, 2021.

\* cited by examiner

MEASUREMENT DEVICE, MEASUREMENT METHOD, AND STORAGE MEDIUM

CROSS-REFERENCE TO RELATED APPLICATION

Priority is claimed on Japanese Patent Application No. 2022-046656, filed Mar. 23, 2022, the content of which is incorporated herein by reference.

BACKGROUND OF THE INVENTION

Field of the Invention

The present invention relates to a measurement device, a measurement method, and a storage medium.

Description of Related Art

Recently, electric vehicles in which a secondary battery such as a lithium ion secondary battery is mounted have continued to spread. A secondary battery deteriorates with repetition of charging and discharging or with the elapse of time. An AC impedance measurement method is known as a method of diagnosing a degree of deterioration progress of a secondary battery.

In the AC impedance measurement method, a response current (voltage) to an AC voltage (current) applied to an electrode system is measured and a ratio thereof is an impedance. A Bode diagram and a Nyquist diagram are often used to indicate this. A Bode diagram is a diagram in which a logarithm of a frequency f (Hz) of an applied AC voltage is plotted on the horizontal axis and a logarithm of an absolute value $|Z|$ (Ω) of an impedance and a phase difference θ (deg) are plotted on the vertical axis. $|Z|$ is a ratio of the amplitude of a response current to an applied AC voltage, and θ is a phase difference between the voltage and the current. In a Nyquist diagram, a real number part of an impedance is plotted on the horizontal axis, and an imaginary number part of the impedance is plotted on a complex number plane. The real number part Re[Z] (resistance) can be calculated using the expression of Re[Z]=$|Z|$cos θ, and the imaginary number part Im[Z] (reactance) can be calculated using the expression of ImV[Z]=$|Z|$sin θ.

Japanese Unexamined Patent Application, First Publication No. 2019-191030 discloses a battery information processing system that processes information on characteristics of a battery module including a plurality of secondary batteries and that includes an analysis device configured to analyze a measurement result of an AC impedance of the battery module and a storage device configured to store a correlation between a plurality of circuit constants included in an equivalent circuit model representing the AC impedance and the characteristics. The analysis device plots the measurement result of the AC impedance on a first frequency characteristic diagram which is a Bode diagram associated with a real number component of the AC impedance and a second frequency characteristic diagram which is a Bode diagram associated with an imaginary number component of the AC impedance, acquires a first polynomial curve through a fitting process of a plotting result on the first frequency characteristic diagram, acquires a second polynomial curve through a fitting process of a plotting result on the second frequency characteristic diagram, converts the first and second polynomial curves to impedance curves on Nyquist diagrams associated with the real number component and the imaginary number component of the AC impedance, extracts the plurality of circuit constants from the impedance curves, and evaluates the characteristics on the basis of the extracted circuit constants with reference to the correlation.

Japanese Unexamined Patent Application, First Publication No. 2013-029412 discloses a battery impedance measurement device that is used for a battery monitoring device configured to measure and monitor, in real time, a battery module in which a plurality of battery cells are connected in series and which drives a real load in a state in which load fluctuation including a high frequency band occurs. The battery impedance measurement device includes a DFT calculating unit configured to perform a discrete Fourier transformation of voltage waveform data and current waveform data of the cells and to calculate an impedance by dividing a discrete Fourier transformation result of the voltage waveform data by a discrete Fourier transformation result of the current waveform data, a circuit model selecting unit configured to select an optimal equivalent circuit model on the basis of features of impedance data calculated by the DFT calculating unit, and a circuit constant estimating and calculating unit configured to perform constant fitting on the equivalent circuit model selected by the circuit model selecting unit. In addition, the circuit model selecting unit in the battery impedance measurement device sequentially determines (1) whether a Warburg element is present, (2) whether an LR parallel circuit is present, and (3) the number of stages of RC parallel circuits with the specific configuration of the equivalent circuit model.

SUMMARY OF THE INVENTION

In measuring an AC impedance, a ratio $|Z|$ of an output signal (a voltage or a current) in response to an AC input signal (a voltage or a current) and a phase delay θ are measured. $|Z|$ and θ are obtained in another rate determining process by changing the frequency f of the input signal. That is, measurement is performed in the routine of (1) inputting a weak AC signal, (2) performing a fast Fourier transformation of a response from a time field to a frequency field, (3) calculating the output/input impedance ratio $|Z|$ and the phase delay θ (a Bode diagram), and (4) plotting a real number part and an imaginary number part of an impedance on a complex number plane (a Nyquist diagram). An impedance spectrum is expressed as a Nyquist diagram in which a real number part (Z') is plotted on the horizontal axis and an imaginary number part (Z") is plotted on the vertical axis. An RC parallel circuit in which a resistor R and a capacitor C are connected in parallel is used as an equivalent circuit of a secondary battery. In measuring an AC impedance of a secondary battery, ideally, an equivalent circuit of a secondary battery to be measured needs to be determined, and one RC parallel circuit is represented as an independent semicircular arc on a Nyquist diagram. However, in an actual secondary battery, since a plurality of circular arcs are represented to overlap, it is difficult to correctly separate the arcs. Particularly, an arc component which is relatively small is not visually ascertained well and a detailed resistance component is overlooked. That is, it is difficult to observe the number of arc components which are represented as RC parallel circuits.

Aspects of the present invention were invented in consideration of the aforementioned circumstances and an objective thereof is to provide a measurement device, a measurement method, and a storage medium that can correctly count the number of RC parallel circuits in an equivalent circuit in measuring an AC impedance of a secondary battery.

In order to achieve the aforementioned objective, the present invention employs the following aspects.

(1) A measurement device according to an aspect of the present invention is a measurement device including an impedance calculator and a signal input and output interface configured to input and output a signal from and to a device connected to the impedance calculator, the impedance calculator performing the following processes (S1) to (S5):

- (S1) causing the impedance calculator to prepare a Bode diagram by plotting a frequency f (Hz) on the horizontal axis and plotting a phase θ (degrees) on the vertical axis;
- (S2) causing the impedance calculator to extract a peak from the prepared Bode diagram, to increase the number of RC parallel circuits by +1, and to fit a mountain shape which is able to be represented by an RC parallel circuit centered on the peak;
- (S3) causing the impedance calculator to subtract a Bode diagram component which is able to be represented by the fitted RC parallel circuit from the Bode diagram of the measurement results;
- (S4) causing the impedance calculator to end identification of the number of RC parallel circuits when a peak is not extracted from the Bode diagram and to repeat the processes (S2) and S(3) when a peak is extracted, a magnitude of the phase (θ) of the peak being equal to or greater than a preset value $\theta_1$; and
- (S5) causing the impedance calculator to report the total number of RC parallel circuits.

In (S1), the impedance calculator performs fitting an inductance component and a diffusing component and removes the fitted components from the Bode diagram of measurement results when the Bode diagram is prepared.

In (S2), a lower limit ($\theta_0$) of a magnitude of a phase (θ) of a peak is preset to distinguish measurement noise and the peak, and the impedance calculator extracts the peak out of peak candidates of which the θ value is equal to or greater than $\theta_0$.

In (S4), a lower limit ($\theta_1$) of a magnitude of a phase (θ) of a peak is preset, and the impedance calculator extracts one peak candidate of which the θ value is equal to or greater than $\theta_1$ as the peak.

(2) According to another aspect of the present invention, there is provided a measurement method of measuring an AC impedance of a secondary battery, which is performed by a processor, the measurement method including: a step S1 of causing the processor to prepare a Bode diagram by plotting a frequency f (Hz) on the horizontal axis (logarithmic axis) and plotting a phase θ (degrees) on the vertical axis; a step S2 of causing the processor to extract a peak from the prepared Bode diagram, to increase the number of RC parallel circuits by +1, and to fit a mountain shape which is able to be represented by an RC parallel circuit centered on the peak; a step S3 of causing the processor to subtract a Bode diagram component which is able to be represented by the fitted RC parallel circuit from the Bode diagram of the measurement results; a step S4 of causing the processor to select a process such that a step S5 is performed when a peak is not extracted from the Bode diagram and the steps S2 and S3 are repeated when a peak is extracted; and the step S5 of causing the processor to report the total number of RC parallel circuits and to end identification of the number of RC parallel circuits.

In the step S1, fitting of an inductance component and a diffusing component is performed and the fitted components are removed from the Bode diagram of measurement results when the Bode diagram is prepared.

In the step S2, a lower limit ($\theta_0$) of a magnitude of a phase (θ) of a peak is preset to distinguish measurement noise and the peak and the processor extracts the peak out of peak candidates of which the θ value is equal to or greater than $\theta_0$.

In the step S4, a lower limit ($\theta_1$) of a magnitude of a phase (θ) of a peak is preset and the processor extracts one peak candidate of which the θ value is equal to or greater than $\theta_1$ as the peak.

(3) According to another aspect of the present invention, there is provided a non-transitory computer-readable storage medium storing a program causing a processor mounted in an impedance calculator of an impedance measurement device to perform:

preparing a Bode diagram by plotting a frequency f (Hz) on the horizontal axis (logarithmic axis) and plotting a phase θ (degrees) on the vertical axis;

extracting a peak from the prepared Bode diagram, increasing the number of RC parallel circuits by +1, and fitting a mountain shape which is able to be represented by an RC parallel circuit centered on the peak;

subtracting a Bode diagram component which is able to be represented by the fitted RC parallel circuit from the Bode diagram of the measurement results;

reporting the total number of RC parallel circuits and ending identification of the number of RC parallel circuits when a peak is not extracted from the Bode diagram; and repeating increasing the number of RC parallel circuits by +1, fitting a mountain shape which is able to be represented by one RC parallel circuit centered on the peak, and subtracting a Bode diagram component which is able to be represented by the fitted RC parallel circuit from the Bode diagram of the measurement results when a peak is additionally extracted.

According to the aspects of (1) to (3), it is possible to distinguish arc components which cannot be distinguished with a Bode diagram indicating a combined impedance and to correctly count the number of RC parallel circuits in an equivalent circuit.

DETAILED DESCRIPTION OF THE INVENTION

Figure 1:
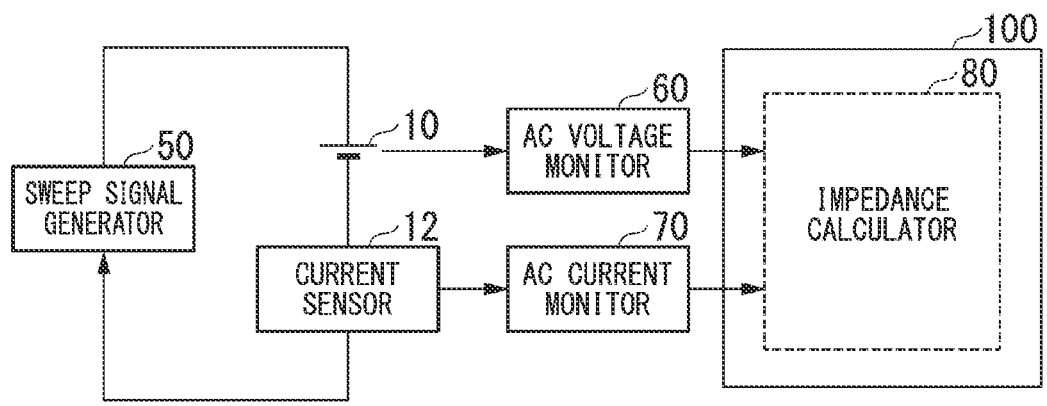
FIG. 1 is a block diagram illustrating a use mode of a measurement device.

Hereinafter, a measurement device, a measurement method, and a storage medium according to an embodiment of the present invention will be described with reference to the accompanying drawings.

In the present invention, a secondary battery is not particularly limited, but a lithium-ion secondary battery can be preferably used.

[Measurement Device]

A measurement device 100 according to the embodiment includes an impedance calculator 80 which will be described later and a signal input and output interface (not illustrated) for inputting and outputting a signal to and from the impedance calculator 80. The impedance calculator 80 includes an interface used to receive an input of a signal from an AC voltage monitor 60 and an AC current monitor 70. The measurement device 100 may be constituted by the impedance calculator 80, but may have the AC voltage monitor 60, the AC current monitor 70, a current sensor 12, and a sweep signal generator 50 incorporated thereinto.

In FIG. 1 illustrating a use mode of the measurement device 100, the sweep signal generator 50 is connected to two ends of a series circuit of a secondary battery 10 and a current sensor 12. The sweep signal generator 50 outputs an AC signal of which an output frequency sweeps to the series circuit of the secondary battery 10 and the current sensor 12.

The AC voltage monitor 60 measures an AC voltage across two ends of the secondary battery 10 and inputs the AC voltage to the impedance calculator 80. The AC current monitor 70 measures an AC current flowing in the current sensor 12 and inputs the AC current to the impedance calculator 80.

The impedance calculator 80 calculates a complex impedance of the secondary battery 10 which is a ratio of the voltage measured by the AC voltage monitor 60 and the current measured by the AC current monitor 70 at each frequency of an output signal of the sweep signal generator 50.

Figure 2:
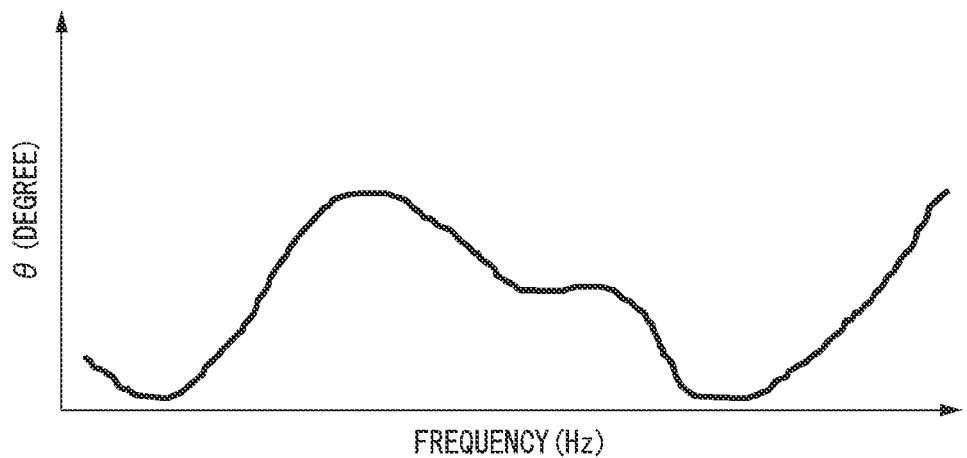
FIG. 2 is a Bode diagram illustrating the number of RC parallel circuits which is counted by an impedance measurement device according to the embodiment.

Identification of the number of RC parallel circuits in the impedance calculator 80 is performed as follows. (1) The impedance calculator 80 prepares a Bode diagram by plotting a frequency f (Hz) of the output signal of the sweep signal generator 50 on the horizontal axis (logarithmic axis) and plotting a phase θ (degrees) thereof on the vertical axis (FIG. 2). At this time, an inductance (L) component and a diffusing (for example, CPE) component are fitted and are removed from the Bode diagram of the measurement results.

Figure 3:
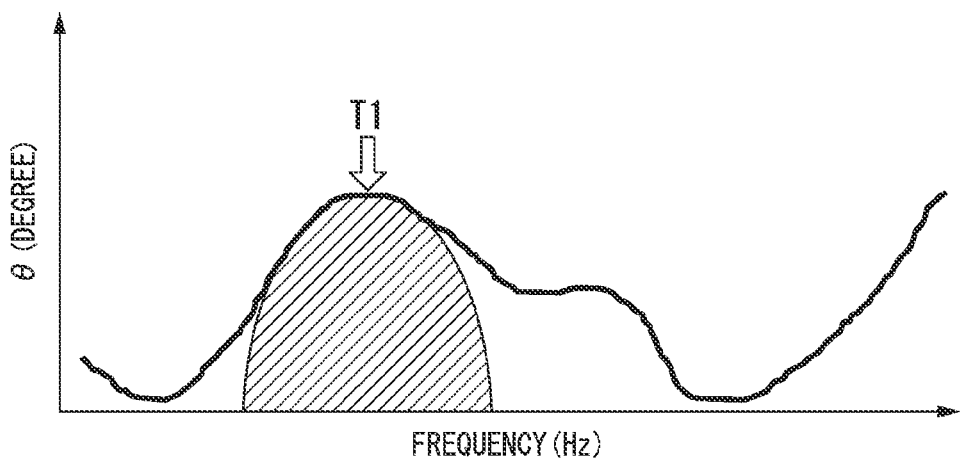
FIG. 3 is a Bode diagram illustrating the number of RC parallel circuits which is counted by the impedance measurement device according to the embodiment.

(2) Then, the impedance calculator 80 extracts a maximum and highest point (hereinafter also referred to as a "peak") T1 from the prepared Bode diagram and counts 1 as the number of RC parallel circuits. The impedance calculator 80 fits a mountain shape which can be represented by an RC parallel circuit centered on the point T1 (FIG. 3). A θ value ($\theta_0$) to be rejected is set to distinguish measurement noise and the maximum and highest point, and the impedance calculator 80 extracts a maximum and highest point (peak) out of points of which the phase (θ) value is equal to or greater than the predetermined value $\theta_0$.

Figure 4:
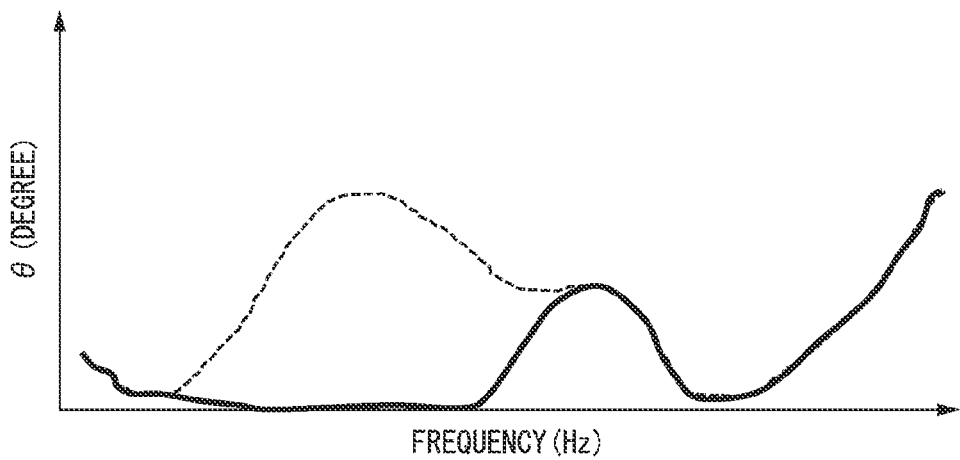
FIG. 4 is a Bode diagram illustrating the number of RC parallel circuits which is counted by the impedance measurement device according to the embodiment.

(3) Then, the impedance calculator 80 subtracts a Bode diagram component which can be represented by the fitted RC parallel circuit from the Bode diagram of measurement results (FIG. 4). That is, the impedance calculator 80 subtracts the phase (θ) value at the same frequency (HZ) therefrom.

(4) When the impedance calculator 80 does not extract a maximum and highest point (peak) from the Bode diagram, the impedance calculator 80 ends identification of the number of RC parallel circuits. When a maximum and highest point (peak) is still extracted, the impedance calculator 80 repeatedly performs the processes (2) and (3). When a magnitude of a phase (θ) preset as a height of a peak on the Bode diagram is equal to or less than a preset value θ1 (for example, 0.5), the increment of the number of RC parallel circuits stops.

Figure 5:
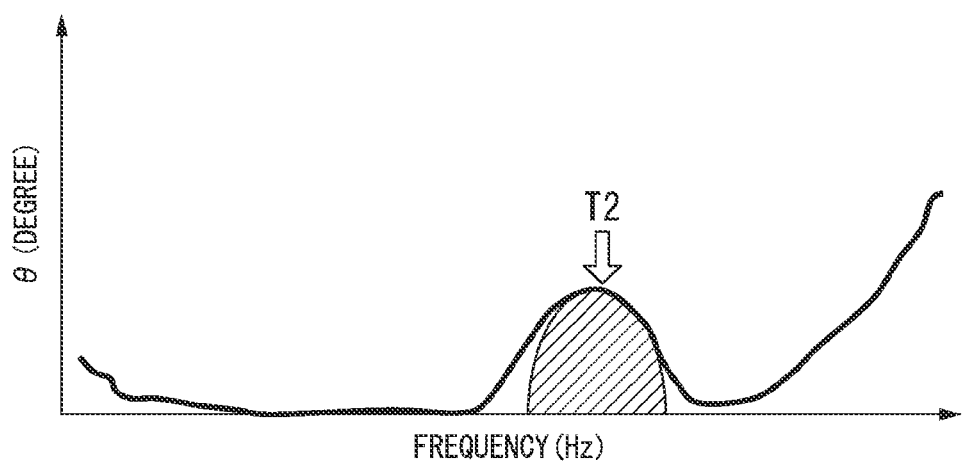
FIG. 5 is a Bode diagram illustrating the number of RC parallel circuits which is counted by the impedance measurement device according to the embodiment.

(2-2) The impedance calculator 80 additionally extracts a peak T2 from the Bode diagram and counts 2 as the number of RC parallel circuits. The impedance calculator 80 fits a mountain shape which can be represented by an RC parallel circuit centered on the peak T2 (FIG. 5).

Figure 6:
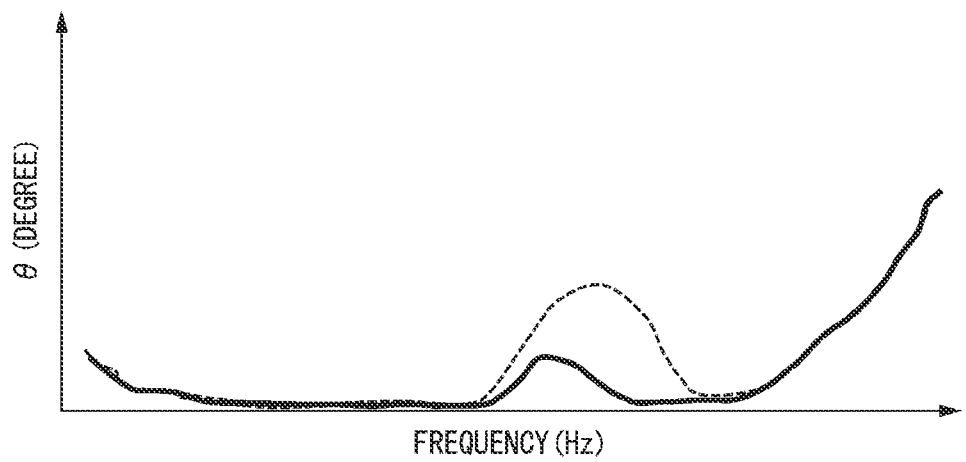
FIG. 6 is a Bode diagram illustrating the number of RC parallel circuits which is counted by the impedance measurement device according to the embodiment.

(3-2) The impedance calculator 80 subtracts a Bode diagram component which can be represented by the fitted RC parallel circuit from the Bode diagram of measurement results (FIG. 6).

(4-2) When the impedance calculator 80 does not extract a maximum and highest point (peak) from the Bode diagram, the impedance calculator 80 ends identification of the number of RC parallel circuits. When a maximum and highest point is still extracted, the impedance calculator 80 further repeatedly performs the processes (2) and (3).

Figure 7:
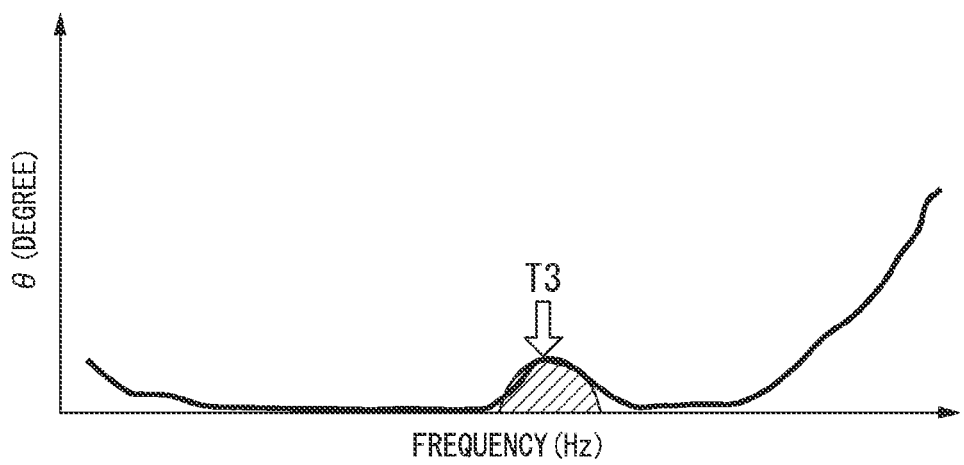
FIG. 7 is a Bode diagram illustrating the number of RC parallel circuits which is counted by the impedance measurement device according to the embodiment.

(2-3) The impedance calculator 80 additionally extracts a peak T3 from the Bode diagram and counts 3 as the number of RC parallel circuits. The impedance calculator 80 fits a mountain shape which can be represented by an RC parallel circuit centered on the peak T3 (FIG. 7).

Figure 8:
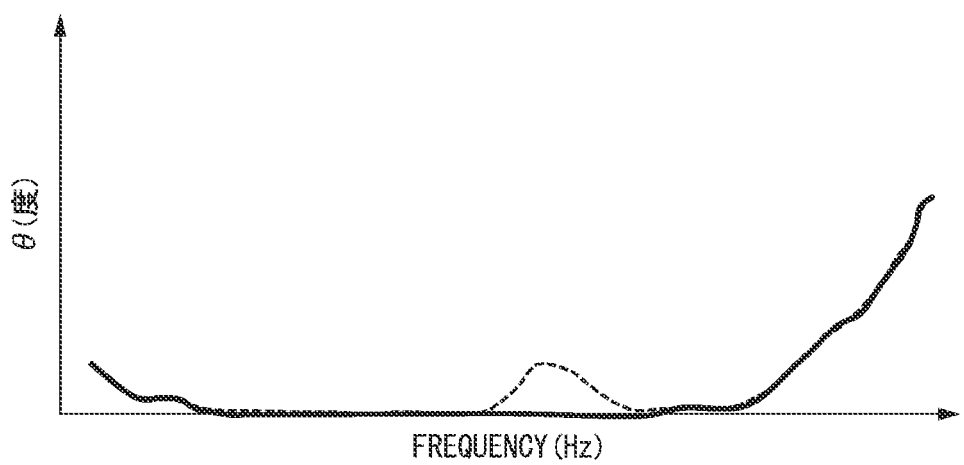
FIG. 8 is a Bode diagram illustrating the number of RC parallel circuits which is counted by the impedance measurement device according to the embodiment.

(3-3) The impedance calculator 80 subtracts a Bode diagram component which can be represented by the fitted RC parallel circuit from the Bode diagram of measurement results (FIG. 8).

(4-3) When the impedance calculator 80 does not extract a maximum and highest point (peak) from the Bode diagram, the impedance calculator 80 ends identification of the number of RC parallel circuits. When a maximum and highest point is still extracted, the impedance calculator 80 further repeatedly performs the processes (2) and (3).

In FIG. 8, since the impedance calculator 80 does not additionally extract a peak, identification of the number of RC parallel circuits ends.

(5) The impedance calculator 80 reports the total number of RC parallel circuits. The impedance calculator 80 according to this embodiment can extract three peaks from the Bode diagram illustrated in FIG. 2. That is, the impedance measurement device 100 according to the present invention can identify the number of RC parallel circuits to be 3 from the Bode diagram illustrated in FIG. 2.

Figure 9:
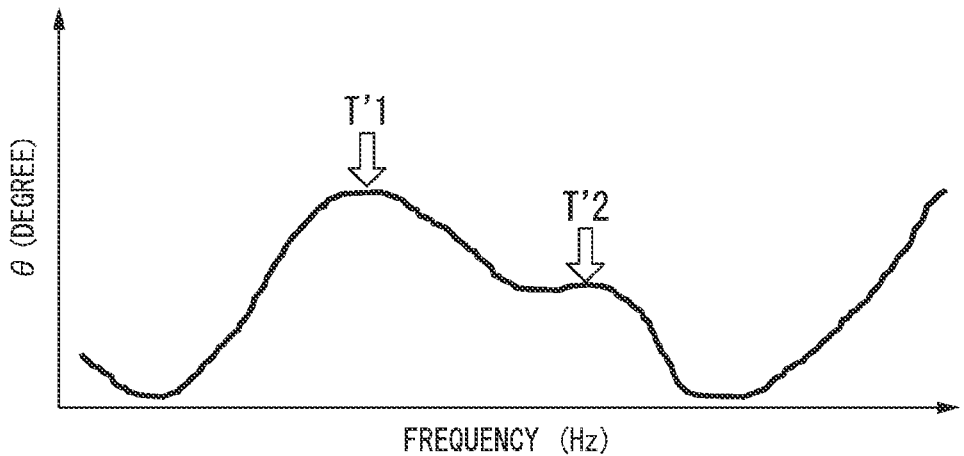
FIG. 9 is a Bode diagram illustrating the number of RC parallel circuits which is counted by an impedance measurement device according to the related art.

A result of identification of the number of RC parallel circuits from an impedance measurement device according to the related art is illustrated in FIG. 9. The impedance measurement device according to the related art can identify the number of RC parallel circuits to be 2 from the same Bode diagram as illustrated in FIG. 2.

Accordingly, the impedance measurement device 100 according to the present invention can extract an arc component (an RC parallel circuit) which has not been extracted from combined impedance data and which has been overlooked and more accurately measure impedance.

The measurement device according to the embodiment includes the impedance calculator and the signal input and output interface. These elements are implemented, for example, by causing a hardware processor such as a central processing unit (CPU) to execute a program (software). Some or all of these elements may be implemented by hardware (a circuit unit including circuitry) such as a large scale integration (LSI) circuit, an application-specific integrated circuit (ASIC), a field-programmable gate array (FPGA), or a graphics processing unit (GPU) or may be cooperatively implemented by software and hardware. The program may be stored in a storage device (a storage device including a non-transitory storage medium) such as a hard disk drive (HDD) or a flash memory, or may be stored in a removable storage medium (a non-transitory storage medium) such as a DVD or a CD-ROM and be installed by setting the storage medium in a drive device).

The aforementioned embodiment can be described as follows:

A device including:
a storage medium storing computer-readable instructions; and
a processor connected to the storage medium,
wherein the processor executes the computer-readable instructions to perform:
preparing a Bode diagram by plotting a frequency f (Hz) on the horizontal axis (logarithmic axis) and plotting a phase θ (degrees) on the vertical axis;
extracting a maximum and highest point (hereinafter also referred to as a "peak") T1 from the prepared Bode diagram, increasing the number of RC parallel circuits by +1, and fitting a mountain shape which is able to be represented by an RC parallel circuit centered on the point T1;
subtracting a Bode diagram component which is able to be represented by the fitted RC parallel circuit from the Bode diagram of the measurement results;
ending identification of the number of RC parallel circuits and reporting the total number of RC parallel circuits when a maximum and highest point (peak) is not extracted from the Bode diagram and repeating (Step S2) and (Step S3) when a maximum and highest point (peak) is additionally extracted.

[Measurement Method]

The measurement method according to the embodiment includes the following steps S1 to S5.

Figure 10:
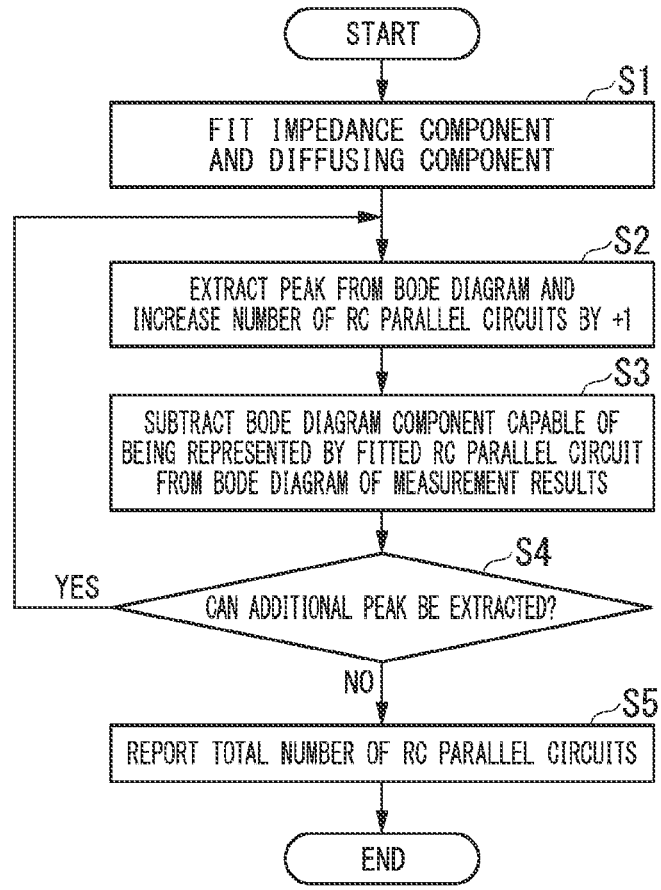
FIG. 10 is a flowchart illustrating an impedance measurement method according to the embodiment.

In describing the measurement method according to the embodiment, the flowchart illustrated in FIG. 10, the configuration diagram illustrated in FIG. 1, and the Bode diagrams illustrated in FIGS. 2 to 4 will be referred to. It is assumed that the AC voltage monitor 60 and the AC current monitor 70 input measurement data to the impedance calculator 80.

(Step S1) A processor mounted in the impedance calculator 80 (hereinafter simply referred to as a "processor") prepares a Bode diagram by plotting a frequency f (Hz) on the horizontal axis (logarithmic axis) and plotting a phase θ (degrees) on the vertical axis (FIG. 2). At this time, an inductance (L) component and a diffusing (for example, CPE) component are fitted and are removed from the Bode diagram of the measurement results.

(Step S2) The processor extracts a maximum and highest point (hereinafter also referred to as a "peak") T1 from the prepared Bode diagram and counts +1 as the number of RC parallel circuits. The processor fits a mountain shape which can be represented by an RC parallel circuit centered on the point T1 (FIG. 3). A θ value ($θ_0$) to be rejected is set to distinguish measurement noise and the maximum and highest point, and the processor extracts the maximum and highest point (peak) out of points of which the θ value is equal to or greater than $θ_0$.

(Step S3) The processor subtracts a Bode diagram component which can be represented by the fitted RC parallel circuit from the Bode diagram of measurement results (FIG. 4). That is, the processor subtracts the phase (θ) value at the same frequency (HZ) therefrom.

(Step S4) When a maximum and highest point (peak) is not extracted from the Bode diagram, the processor performs Step S5. When a maximum and highest point (peak) is still extracted, the processor repeatedly performs the processes (2) and (3).

(Step S5) The processor reports the total number of RC parallel circuits and ends identification of the number of RC parallel circuits.

[Program]

The program according to the embodiment is a program causing the processor mounted in the impedance calculator to perform the following processes (S1) to (S5):

(S1) preparing a Bode diagram by plotting a frequency f (Hz) on the horizontal axis (logarithmic axis) and plotting a phase θ (degrees) on the vertical axis;

(S2) extracting a peak from the prepared Bode diagram, increasing the number of RC parallel circuits by +1, and fitting a mountain shape which is able to be represented by an RC parallel circuit centered on the peak;

(S3) subtracting a Bode diagram component which is able to be represented by the fitted RC parallel circuit from the Bode diagram of the measurement results;

(S4) reporting the total number of RC parallel circuits and ending identification of the number of RC parallel circuits when a peak is not extracted from the Bode diagram and repeating the steps (S2) and S(3) when a peak is additionally extracted; and (S5) reporting the total number of RC parallel circuits.

While a mode for carrying out the present invention has been described above with reference to an embodiment, the present invention is not limited to the embodiment, and various modifications and substitutions can be performed thereon without departing from the gist of the present invention.

What is claimed is:

1. A measurement device configured to measure an AC impedance of a secondary battery, the measurement device comprising an impedance calculator and a signal input and output interface configured to input and output a signal from and to a device connected to the impedance calculator,
wherein the impedance calculator performs the following processes of (S1) to (S5):
(S1) causing the impedance calculator to prepare a Bode diagram by plotting a frequency f (Hz) on the horizontal axis and plotting a phase θ (degrees) on the vertical axis, the impedance calculator performing fitting of an inductance component and a diffusing component and removing the fitted components from the Bode diagram of measurement results when the Bode diagram is prepared;
(S2) causing the impedance calculator to extract a peak from the prepared Bode diagram, to increase the number of RC parallel circuits by +1, and to fit a mountain shape which is able to be represented by an RC parallel circuit centered on the peak, a θ value to be rejected ($\theta_0$) being set to distinguish measurement noise and the peak, the impedance calculator extracting the peak out of points of which a phase (θ) is equal to or greater than the predetermined value $\theta_0$;

(S3) causing the impedance calculator to subtract a Bode diagram component which is able to be represented by the fitted RC parallel circuit from the Bode diagram of the measurement results;

(S4) causing the impedance calculator to end identification of the number of RC parallel circuits when a peak is not extracted from the Bode diagram and to repeat the processes (S2) and (S3) when a peak is extracted, a magnitude of the phase (θ) of the peak being equal to or greater than a preset value $\theta_1$; and (S5) causing the impedance calculator to report the total number of RC parallel circuits.

2. A measurement method of measuring an AC impedance of a secondary battery, which is performed by a processor, the measurement method comprising:

a step S1 of causing the processor to prepare a Bode diagram by plotting a frequency f (Hz) on the horizontal axis (logarithmic axis) and plotting a phase θ (degrees) on the vertical axis;

a step 2 of causing the processor to extract a peak from the prepared Bode diagram, to increase the number of RC parallel circuits by +1, and to fit a mountain shape which is able to be represented by an RC parallel circuit centered on the peak;

a step S3 of causing the processor to subtract a Bode diagram component which is able to be represented by the fitted RC parallel circuit from the prepared Bode diagram;

a step S4 of causing the processor to select a process such that a step S5 is performed when a peak is not extracted from the Bode diagram and the steps S2 and S3 are repeated when a peak is extracted; and the step S5 of causing the processor to report the total number of RC parallel circuits and to end identification of the number of RC parallel circuits, wherein fitting of an inductance component and a diffusing component is performed and the fitted components are removed from the Bode diagram of measurement results when the Bode diagram is prepared in the step S1, wherein a lower limit ($\theta_0$) of a magnitude of a phase (θ) of a peak is preset to distinguish measurement noise and the peak and the processor extracts the peak out of peak candidates of which the θ value is equal to or greater than 00 in the S2, and wherein a lower limit ($\theta_1$) of a magnitude of a phase (θ) of a peak is preset and the processor extracts one peak candidate of which the θ value is equal to or greater than $\theta_1$ as the peak.

3. A program for measuring an AC impedance of a secondary battery, the program causing a processor mounted in an impedance calculator to perform the following processes (S1) to (S5), the impedance calculator being provided in an impedance measurement device along with a signal input and output interface configured to input and output a signal from and to a device connected to the impedance calculator:

(S1) preparing a Bode diagram by plotting a frequency f (Hz) on the horizontal axis (logarithmic axis) and plotting a phase θ (degrees) on the vertical axis;

(S2) extracting a peak from the prepared Bode diagram, increasing the number of RC parallel circuits by +1, and fitting a mountain shape which is able to be represented by an RC parallel circuit centered on the peak;

(S3) subtracting a Bode diagram component which is able to be represented by the fitted RC parallel circuit from the Bode diagram of the measurement results;

(S4) reporting the total number of RC parallel circuits and ending identification of the number of RC parallel circuits when a peak is not extracted from the Bode diagram and repeating the steps (S2) and S(3) when a peak is additionally extracted; and (S5) reporting the total number of RC parallel circuits.

* * * * *